(12) United States Patent
Mizusawa et al.

(10) Patent No.: US 6,322,947 B1
(45) Date of Patent: *Nov. 27, 2001

(54) PHOTOSENSITIVE COMPOSITION FOR SANDBLASTING AND PHOTOSENSITIVE FILM LAMINATE COMPRISING THE SAME

(75) Inventors: Ryuma Mizusawa; Shinkichi Asahi; Syunzi Nakazato; Hiroyuki Obiya, all of Kanagawa (JP)

(73) Assignee: Tokyo Ohka Kogyo Co., Ltd., Kanagawa (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/374,162

(22) Filed: Aug. 13, 1999

(30) Foreign Application Priority Data

Aug. 17, 1998 (JP) .................................................. 10-246551

(51) Int. Cl.$^7$ .................................................. G03F 7/004
(52) U.S. Cl. .................................... 430/270.1; 430/284.1; 430/905; 430/911; 430/913
(58) Field of Search ............................ 430/270.1, 284.1, 430/905, 911, 913

(56) References Cited

U.S. PATENT DOCUMENTS

| | | | |
|---|---|---|---|
| 4,001,015 | * | 1/1977 | Barzynski et al. ............... 430/302 |
| 4,188,222 | * | 2/1980 | Nezu et al. ..................... 430/284.1 |
| 4,198,241 | * | 4/1980 | Bronstert et al. ............... 430/284.1 |
| 4,284,731 | * | 8/1981 | Moser et al. ..................... 525/28 |
| 4,960,673 | * | 10/1990 | Beck et al. ..................... 430/271.1 |
| 5,290,663 | * | 3/1994 | Huynh-Tran .................... 430/284.1 |
| 5,756,261 | * | 5/1998 | Takehana et al. ............... 430/284.1 |
| 5,776,995 | * | 7/1998 | Obiya et al. ..................... 522/15 |
| 5,916,738 | * | 6/1999 | Takehana et al. ............... 430/323 |
| 5,919,569 | * | 7/1999 | Obiya et al. ..................... 428/423.7 |
| 5,924,912 | * | 7/1999 | Takehana et al. ............... 451/29 |
| 6,054,545 | * | 4/2000 | Oshio et al. ..................... 527/301 |
| 6,126,513 | * | 10/2000 | Oshio et al. ..................... 451/28 |

FOREIGN PATENT DOCUMENTS

| | | |
|---|---|---|
| A-55-103554 | 8/1980 | (JP) . |
| A-60-010242 | 1/1985 | (JP) . |
| A-02-069754 | 3/1990 | (JP) . |
| A-06-161098 | 7/1994 | (JP) . |
| 11119430-A | * 4/1999 | (JP) . |

OTHER PUBLICATIONS

DE 19846851A, abstract—Photosensitive composition and film for sand blasting for making printed circuit or insulation of plasma display panel. Mizusawa et al. Apr. 15, 1999.*

* cited by examiner

*Primary Examiner*—Janet Baxter
*Assistant Examiner*—Yvette M. Clarke
(74) *Attorney, Agent, or Firm*—Fish & Richardson, P.C.

(57) ABSTRACT

A photosensitive composition for sandblasting and a photosensitive film laminate having a photosensitive layer comprising the photosensitive composition are disclosed, the photosensitive composition comprising (A) a photopolymerizable urethane (meth)acrylate oligomer having at least two acryloyl groups and/or methacryloyl groups and a structural unit represented by formula:

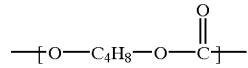

(B) an alkali-soluble compound, and (C) a photopolymerization initiator.

9 Claims, No Drawings

PHOTOSENSITIVE COMPOSITION FOR SANDBLASTING AND PHOTOSENSITIVE FILM LAMINATE COMPRISING THE SAME

FIELD OF THE INVENTION

This invention relates to a novel photosensitive composition for sandblasting. More particularly it relates to a photosensitive composition for sandblasting which exhibits excellent alkali developability, sufficient adhesion to a substrate, and photosensitivity and, after patterning, has high elasticity and softness and excellent resistance to sandblasting and therefore enables fine and precise patterning and to a photosensitive film laminate comprising the same.

BACKGROUND OF THE INVENTION

Sandblasting is known as one of the techniques for patterning the surface of a substrate such as glass, stone, plastics, ceramics, leather, and wood. Sandblasting is carried out by a process using a stencil in which a rubber sheet, paper, etc. is stuck to the substrate and cut with a cutter, etc. to form a stencil pattern, and an abrasive is made to strike against the substrate to selectively abrade the substrate or a process using a photomask in which a photosensitive layer of a photosensitive composition is provided on the substrate, a mask pattern is formed by photolithography, and an abrasive is made to strike against the substrate to selectively abrade the substrate. The former process involves troublesome operations with low working efficiency. On the other hand, the latter photolithographic process achieves high working efficiency, enables fine processing, and is effective for producing circuit boards composed of a metallic pattern and an insulating pattern, particularly for the formation of a metallic wiring pattern and an insulating pattern made of ceramics, fluorescence substances, etc. of a plasma display panel.

Photosensitive compositions which have been proposed to date for use in the lithographic sandblasting include a composition comprising a urethane prepolymer having an ethylenically unsaturated group at the terminal, a monofunctional ethylenically unsaturated compound, and a polymerization initiator (see JP-A-60-10242), a composition comprising an unsaturated polyester, an unsaturated monomer, and a photopolymerization initiator (see JP-A-55-103554), and a composition comprising polyvinyl alcohol and a diazo resin (see JP-A-2-69754). The term "JP-A" as used herein means an unexamined published Japanese patent application. However, these photosensitive resin compositions are disadvantageous in that film thickness control is difficult, sensitivity, adhesion to a substrate and resistance to sandblasting are insufficient, and fine processing is difficult. In order to overcome these disadvantages, JP-A-6-161098 proposed a photosensitive composition for sandblasting which comprises a urethane prepolymer terminated with an ethylenically unsaturated group as a main component, a cellulose derivative, and a polymerization initiator. Although this composition is excellent in not only alkali developability but sensitivity, adhesion to a substrate, and elasticity and softness after patterning and is superior in sandblasting resistance to conventional photosensitive compositions, it is still unsatisfactory in performance in fine pattern formation for practical use. It has therefore been keenly demanded to develop a photosensitive composition having improved properties.

SUMMARY OF THE INVENTION

An object of the present invention is to provide a photosensitive composition for sandblasting which is excellent in alkali developability, sensitivity, adhesion to a substrate, and elasticity, softness and resistance to sandblasting after patterning and is suited to formation of fine metallic or insulating patterns.

Another object of the invention is to provide a photosensitive film laminate having a photosensitive layer comprising the above-described photosensitive composition.

The inventors have continued their study and reached the finding that a photosensitive composition for sandblasting which is freed of the above-mentioned disadvantages of conventional photosensitive compositions and is capable of forming a fine pattern can be obtained by using a photopolymerizable urethane (meth) acrylate oligomer containing, as an essential structural unit, a reaction product between a diisocyanate compound and 1,4-butanediol. The present invention has been completed based on this finding.

The present invention relates to a photosensitive composition for sandblasting comprising (A) a photopolymerizable urethane (meth)acrylate oligomer having at least two acryloyl groups and/or methacryloyl groups and a structural unit represented by formula:

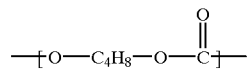

(B) an alkali-soluble compound, and (C) a photopolymerization initiator.

The present invention also relates to a photosensitive film laminate having a photosensitive layer comprising the photosensitive composition.

The photosensitive composition for sandblasting according to the present invention has excellent alkali developability, sensitivity, and adhesion and, after pattern formation, exhibits elasticity and softness and resistance to sandblasting and is suited to formation of fine patterns such as metallic patterns and insulating patterns. The photosensitive film laminate according to the present invention is easy to position and is preferred for fine patterning on electronic components.

DETAILED DESCRIPTION OF THE INVENTION

The photopolymerizable urethane (meth)acrylate oligomer, which can be used as a component characteristic of the photosensitive composition of the invention, contains a reaction product between a diisocyanate compound and 1,4-butanediol as an essential structural unit. The photopolymerizable urethane (meth)acrylate is a product obtained by the reaction of the structural unit with a (meth) acrylate compound having a hydroxyl group or a carboxyl group. Containing the diisocyanate compound/1,4-butanediol reaction product as an essential structural unit, the photosensitive composition of the invention exhibits improved adhesion to a substrate and improved sandblasting resistance and therefore realizes precise formation of fine patterns such as a metallic wiring pattern and an insulating pattern, particularly a metallic wiring pattern and a ceramic or fluorescent insulating pattern for a plasma display panel. In particular, a urethane (meth)acrylate oligomer having four or more urethane bonds in the molecule thereof is preferred. If the number of urethane bonds in the urethane (meth)acrylate oligomer is less than 4, the resistance to sandblasting is reduced considerably.

The diisocyanate compound which can be used for the preparation of the urethane (meth)acrylate oligomer includes aliphatic or alicyclic diisocyanate compounds, such as dimethylene diisocyanate, trimethylene diisocyanate, tetramethylene diisocyanate, pentamethylene diisocyanate, hexamethylene diisocyanate, heptamethylene diisocyanate, 2,2-dimethylpentane-1,5-diisocyanate, octamethylene diisocyanate, 2,5-dimethylhexane-1,6-diisocyanate, 2,2,4-trimethylpentane-1,5-diisocyanate, nonamethylene diisocyanate, 2,2,4-trimethylhexane diicoayanate, decamethylene diisocyanate, and isophorone diisocyanate. They can be used either individually or as a combination of two or more thereof.

If desired, 1,4-butanediol, which reacts with the diisocyanate compound to form the essential structural unit, can be used in combination with one or more of other diol compounds. Useful other diol compounds include alkylene glycols (e.g., ethylene glycol, propylene glycol, diethylene glycol, triethylene glycol, dipropylene glycol, and neopentyl glycol) and compounds having a hydroxyl group at both terminals thereof that are obtained by allowing such an alkylene glycol to react with maleic acid, fumaric acid, glutaric acid, adipic acid, δ-valerolactone, ε-caprolactone, β-propiolactone, α-methyl-β-propiolactone, β-methyl-β-propiolactone, α-methyl-β-propiolactone, β-methyl-β-propiolactone, α,α-dimethyl-β-propiolactone, β,β-dimethyl-β-propiolactone, bisphenol A, hydroquinone, dihydroxycyclohexane, diphenyl carbonate, phosgene, succinic anhydride, etc.

The (meth)acrylate compound having a hydroxyl group or a carboxyl group which can be used in the invention includes hydroxymethyl acrylate, hydroxymethyl methacrylate, 2-hydroxyethyl acrylate, 2-hydroxyethyl methacrylate, 3-hydroxypropyl acrylate, 3-hydroxypropyl methacrylate, ethylene glycol monoacrylate, ethylene glycol monomethacrylate, glycerol acrylate, glycerol methacrylate, dipentaerythritol monoacrylate, dipentaerythritol monomethacrylate, acrylic acid, methacrylic acid, monohydroxyethyl acrylate phthalate, and ω-carboxypolycaprolactone monoacrylate. They can be used either individually or as a combination of two or more thereof.

The urethane (meth)acrylate oligomer preferably has a weight-average molecular weight of 1,000 to 30,000. If the weight-average molecular weight is less than 1000, a cured film of the photosensitive composition has an increased bonding force to have increased hardness, which reduces resistance to sandblasting. If the weight-average molecular weight exceeds 30,000, the composition has an increased viscosity, which deteriorates coating properties and workability, and the resulting cured film will have an increased electrical resistance.

The photosensitive composition of the present invention contains an alkali-soluble compound. Suitable alkali-soluble compounds includes cellulose derivative (generally having a molecular weight of 20,000 to 200,000, preferably from 30,000 to 150,000), such as hydroxypropyl cellulose, ethylhydroxyethyl cellulose, hydroxypropylmethyl cellulose phthalate, and hydroxypropylmethyl cellulose acetate phthalate, and acrylic acid or methacrylic acid copolymers (generally having a molecular weight of 10,000 to 150,000, preferably from 30,000 to 100,000). Suitable comonomers of the acrylic or methacrylic acid copolymers include fumaric acid, maleic acid, crotonic acid, cinnamic acid, methyl acrylate, methyl methacrylate, ethyl acrylate, ethyl methacrylate, butyl acrylate, butyl methacrylate, isobutyl acrylate, isobutyl methacrylate, monomethyl fumarate, monoethyl fumarate, monopropyl fumarate, monomethyl maleate, monoethyl maleate, monopropyl maleate, sorbic acid, hydroxymethyl acrylate, hydroxymethyl methacrylate, 2-hydroxyethyl acrylate, 2-hydroxyethyl methacrylate, 2-hydroxypropyl acrylate, 2-hydroxypropyl methacrylate, ethylene glycol monoacrylate, ethylene glycol monomethacrylate, glycerol acrylate, glycerol methacrylate, dipentaerythritol monoacrylate, dipentaerythritol monomethacrylate, dimethylaminoethyl acrylate, dimethylaminoethyl methacrylate, tetrahydrofurfuryl acrylate, tetrahydrofurfuryl methacrylate, acrylamide, methacrylamide, acrylonitrile, and methacrylonitrile. The alkali-soluble compound is preferably used in an amount of 10 to 100 parts by weight per 100 parts by weight of the urethane (meth) acrylate oligomer.

The photopolymerization initiator which can be used in the invention includes 1-hydroxycyclohexyl phenyl ketone, 2,2-dimethoxy-1,2-diphenylethan-1-one, 2-methyl-1-[4-(methylthio)phenyl]-2-morpholinopropan-1-one, 2-benzyl-2-dimethylamino-1-(4-morpholinophenyl)-butan-1-one, 2-hydroxy-2-methyl-1-phenylpropan-1-one, 2,4,6-trimethylbenzoyldiphenylphosphine oxide, 1-[4-(2-hydroxyethoxy)phenyl]-2-hydroxy-2-methyl-1-propan-1-one, 2,4-diethylthioxanthone, 2-chlorothioxanthone, 2,4-dimethylthioxanthone, 3,3-dimethyl-4-methoxybenzophenone, benzophenone, 1-chloro-4-propoxythioxanthone, 1-(4-isopropylphenyl)-2-hydroxy-2-methylpropan-1-one, 1-(4-dodecylphenyl)- 2-hydroxy-2-methylpropan-1-one, 4-benzoyl-4'-methyldimethyl sulfide, 4-dimethylaminobenzoic acid, methyl 4-dimethylaminobenzoate, ethyl 4-dimethylaminobenzoate, butyl 4-dimethylaminobenzoate, 2-ethylhexyl 4-dimethylaminobenzoate, 2-isoamyl 4-dimethylaminobenzoate, 2,2-diethoxyacetophenone, benzyl dimethyl ketal, benzyl-β-methoxyethyl acetal, 1-phenyl-1,2-propanedione-2-(o-ethoxycarbonyl) oxime, methyl o-benzoylbenzoate bis(4-dimethylaminophenyl) ketone, 4,4'-bisdiethylaminobenzophenone, 4,4'-dichlorobenzophenone, benzil, benzoin, benzoin methyl ether, benzoin ethyl ether, benzoin isopropyl ether, benzoin n-butyl ether, benzoin isobutyl ether, p-dimethylaminoacetophenone, p-t-butyltrichloroacetophenone, p-t-butyldichloroacetophenone, thioxanthone, 2-methylthioxanthone, 2-isopropylthioxanthone, dibenzosuberone, α,α-dichloro-4-phenoxyacetophenone, and pentyl 4-dimethylaminobenzoate. These initiators can be used either individually or as a mixture of two or more thereof. The photopolymerization initiator is used preferably in an amount of 0.1 to 20 parts by weight per 100 parts by weight of the solids content of the photosensitive composition.

If desired, the photosensitive composition can additionally comprise a photopolymerizable monomer to have further improved sensitivity and to prevent the cured film from decreasing its thickness or swelling on developing. Useful photopolymeriziable monomers include monofunctional acrylic monomers, such as acrylic acid, methacrylic acid, 2-hydroxyethyl acrylate, and ethylene glycol monomethyl ether acrylate; and polyfunctional acrylic monomers, such as trimethylolpropane triacrylate and tetramethylolpropane tetraacrylate. The photopolymerizable monomer is suitably used in an amount of not more than 20 parts by weight per 100 parts by weight of the urethane (meth)acrylate oligomer.

The photosensitive composition of the present invention can be used as dissolved in an organic solvent. Illustrative examples of useful solvents are ethylene glycol monomethyl ether, ethylene glycol monoethyl ether, propylene glycol monomethyl ether, propylene glycol monoethyl ether, diethylene glycol monomethyl ether, diethylene glycol monoethyl ether, diethylene glycol dimethyl ether, diethylene glycol diethyl ether, 2-methoxybutyl acetate, 3-methoxybutyl acetate, 4-methoxybutyl acetate, 2-methyl-3-methoxybutyl acetate, 3-methyl-3-methoxybutyl acetate, 3-ethyl-3-methoxybutyl acetate, 2-ethoxybutyl acetate, and 4-ethoxybutyl acetate.

The photosensitive composition for sandblasting can be applied as a liquid to a substrate or screen printed on a substrate according to the use. In the fields where precise processing is required, for example in the manufacture of electronic components, the composition is preferably used in the form of a dry photosensitive film which is formed by applying the composition on to a flexible film substrate followed by drying.

Such a photosensitive film laminate is prepared by applying a solution of the photosensitive composition in an appropriate solvent to a flexible film made of a synthetic resin (e g., polyethylene terephthalate, polyethylene, polypropylene, polycarbonate, polyvinyl chloride, etc.) having a thickness of, for example, 15 to 125 $\mu$m by means of an applicator, a bar coater, a roll coater, a curtain flow coater, and so forth to provide a dry thickness of 10 to 100 $\mu$m, and drying the coating layer. If necessary, a release film can be provided on the photosensitive layer for protection until use. A preferred release film includes a film of polyethylene terephthalate (PET), polyethylene, polypropylene, etc. having a thickness of about 15 to 125 $\mu$m with silicone applied or baked thereon.

If desired, a water-soluble resin layer can be provided between the flexible film and the photosensitive layer in order to prevent the photosensitive layer from being desensitized by oxygen and to prevent a mask pattern from adhering to the photosensitive layer when it is brought into contact with the photosensitive layer for exposure. The water-soluble resin layer is preferably formed by applying a 5 to 20% by weight aqueous solution of a water-soluble polymer, such as polyvinyl alcohol or partially saponified polyvinyl acetate, to the flexible film to a dry thickness of 1 to 10 $\mu$m, followed by drying.

A typical manner of use of the photosensitive film laminate according to the present invention is as follows. The release film is stripped off the film laminate. The exposed photosensitive layer brought into intimate contact with a substrate preferably by hot pressing. Hot pressing is carried out by preheating the substrate, putting the photosensitive film thereon, and pressing. The flexible film is then removed to expose the photosensitive layer. A mask having a prescribed mask pattern is brought into contact therewith, and light for exposure is irradiated through the mask to expose the photosensitive layer. Examples of the light for exposure include excimer laser light, X-rays, and electron beams as well as ultraviolet light. A low-pressure mercury lamp, a high-pressure mercury lamp, a ultrahigh-pressure mercury lamp, a xenon lamp, etc. can be used. After exposure, the mask is removed, and the exposed film is developed with a general-purpose alkali developer to remove the unexposed area. The alkalis which can be used in the alkali developer include hydroxides, carbonates, hydrogencarbonates, phosphates or pyrophosphates of alkali metals such as lithium, sodium and potassium; primary amines, such as benzylamine and butylamine; secondary amines, such as dimethylamine, dibenzylamine, and diethanolamine; tertiary amines, such as trimethylamine, triethylamine, and triethanolamine; cyclic amines, such as morpholine, piperazine, and pyridine; polyamines, such as ethylenediamine and hexamethylenediamine; ammonium hydroxide compounds, such as tetramethylammonium hydroxide, tetraethylammonium hydroxide, trimethylbenzylammonium hydroxide, and trimethylphenylbenzylamonium hydroxide; sulfonium hydroxide compounds, such as trimethylsulfonium hydroxide, diethylmethylsulfonium hydroxide, and dimethylbenzylsulfonium hydroxide; choline; and silicate-containing buffers. After the development, the substrate on which only the exposed and cured area of the photosensitive film remains is etched by sandblasting to form a desired pattern. Abrasive grains which can be used for sandblasting include glass beads or inorganic particles (e.g., SiC, $SiO_2$, $Al_2O_3$ or ZrO) having a particle size of 2 to 500 $\mu$m.

The present invention will now be illustrated in greater detail with reference to Examples, but it should be understood that the present invention is not construed as being limited thereto. Unless otherwise noted, all the percents and parts are given by weight.

EXAMPLE 1

Fifty parts of a 20% ethyl acetate solution of a carboxyl-containing urethane acrylate oligomer having a reaction product of a diisocyanate compound and 1,4-butanediol as a structural unit (UV-9510EA, produced by The Nippon Synthetic Chemical Industry Co., Ltd.; weight average molecular weight (Mw): 10,000; acid value: 20), 60 parts of a 25% methyl ethyl ketone solution of hydroxypropylmethyl cellulose acetate phthalate (HPMCAP, produced by Shin-Etsu Chemical Co., Ltd.) were mixed The mixture was further mixed with 1 part of 2,2-dimethoxy-2-phenylacetophenone, 0.005 part of N-nitrosophenylhydroxylamine aluminum salt, 0.1 part of Malachite Green (produced by Hodogaya Chemical Co., Ltd.), and 20 parts of methyl ethyl ketone by stirring to prepare a photosensitive composition for sandblasting.

The resulting photosensitive composition was applied to a 20 $\mu$m thick PET film with an applicator to a dry thickness of 30 $\mu$m and dried to form a photosensitive layer. A 20 $\mu$m thick polyethylene film was adhered onto the photosensitive layer under a rubber roller taking care not to entrap air bubbles to obtain a photosensitive film laminate.

The polyethylene film was stripped from the laminate, and the thus exposed photosensitive layer was superposed on a glass substrate preheated to 80° C., and pressed under a rubber roller. The PET film was peeled off, and a test pattern mask was brought into intimate contact with the exposed photosensitive layer. The photosensitive layer was exposed to ultraviolet light emitted from an ultrahigh-pressure mercury lamp at an energy of 200 mJ/cm$^2$ through the mask. The mask was removed, and a 0.2% sodium carbonate aqueous solution kept at 30° C was sprayed at a spray pressure of 1.5 kg/cm$^2$ for 30 seconds to form a pattern.

The minimum line width of the pattern thus formed was 25 $\mu$m, which is indicative of the adhesion of the pattern layer to the substrate. The sensitivity as measured with a Stouffer 21-step tablet (Stouffer Graphic Arts Equipment Co.) was 6-step.

Resistance to sandblasting was evaluated as follows. The polyethylene release film was stripped from the photosensitive film laminate, and the exposed photosensitive layer was superposed on a glass substrate preheated to 80° C. and pressed under a rubber roller. The PET film was removed, and the entire surface of the exposed photosensitive layer was exposed to light at an exposure energy of 200 mJ/cm$^2$. The thus cured resin layer was subjected to sandblasting with glass beads (#800, produced by Fuji Seisakusyo) spouted from a sandblast nozzle, which was located at a distance of 80 mm away from the cured resin layer, under a blasting pressure of 2 kg/cm$^2$. The time required for the cured resin layer to disappear by abrasive wear was 200 seconds.

Comparative Example 1

A photosensitive film laminate for sandblasting was prepared in the same manner as in Example 1, except for replacing the 20% ethyl acetate solution of UV-9510EA with a 20% ethyl acetate solution of a carboxyl-containing urethane acrylate oligomer having a reaction product of a diisocyanate compound, ethylene glycol and neopentyl glycol as a structural unit (UV-9532EA, produced by The Nippon Synthetic Chemical Industry Co., Ltd.; Mw: 10,000; acid value: 22). The adhesion to the substrate, sensitivity, and resistance to sandblasting as measured in the same manner as in Example 1 were 35 μm, 6-step, and 90 seconds, respectively.

While the invention has been described in detail and with reference to specific examples thereof, it will be apparent to one skilled in the art that various changes and modifications can be made therein without departing from the spirit and scope thereof.

What is claimed is:

1. A photosensitive film laminate for sandblasting comprising a flexible film, a photosensitive layer provided on said flexible film, and a release film provided on said photosensitive layer, wherein said photosensitive layer comprises (A) a photopolymerizable urethane acrylate or (meth) acrylate oligomer comprising at least two groups independently selected from acryloyl and methacryloyl groups and a structural unit represented by the formula:

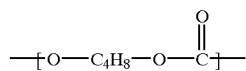

(B) at least one alkali-soluble compound which is hydroxypropylmethyl cellulose acetate phthalate, and (C) a photopolymerization initiator.

2. The photosensitive film laminate of claim 1, wherein the molecular weight of the alkali-soluble compound is between 20,000 and 200,000.

3. The photosensitive film laminate of claim 1, wherein the molecular weight of the alkali-soluble compound is between 30,000 to 150,000.

4. The photosensitive film laminate of claim 1, wherein the molecular weight of the alkali-soluble compound is present in an amount of from 10 to 100 parts by weight per 100 parts by weight of urethane acrylate or (meth)acrylate oligomer.

5. A photosensitive film laminate for sandblasting comprising a flexible film, a photosensitive layer provided on said flexible film, and a release film provided on said photosensitive layer, wherein said photosensitive layer comprises (A) a photopolymerizable urethane acrylate or (meth) acrylate oligomer obtained by allowing (a) a reaction product between a diisocyanate compound and a diol mixture comprising 1,4 butanediol with (b) compounds comprising acrylate or methacrylate moieties having a hydroxyl group or a carboxyl group, (B) at least one alkali-soluble compound which is hydroxypropylmethyl cellulose acetate phthalate, and (C) a photopolymerization initiator.

6. The photosensitive film laminate of claim 5, wherein the diol mixture further comprises a diol selected from the group consisting of alkylene glycols and compounds having a hydroxyl group at both terminals thereof, that are obtained by allowing an alkylene glycol to react with an acid selected from the group consisting of maleic acid, fumaric acid, glutaric acid, adipic acid, δ-valerolactone, ε-caprolactone, β-propiolactone, α-methyl-β-propiolactone, β-methyl-β-propiolactone, α,α-dimethyl-β-propiolactone, β,β-dimethyl-β-propiolactone, bisphenol A, hydroquinone, dihydroxycyclohexane, diphenyl carbonate, phosgene, and succinic anhydride.

7. The photosensitive film laminate of claim 5, wherein the molecular weight of the alkali-soluble compound is between 20,000 and 200,000.

8. The photosensitive film laminate of claim 5, wherein the molecular weight of the alkali-soluble compound is between 30,000 to 150,000.

9. The photosensitive film laminate of claim 5, wherein the molecular weight of the alkali-soluble compound is present in an amount of from 10 to 100 parts by weight per 100 parts by weight of urethane acrylate or (meth)acrylate oligomer.

* * * * *